(12) United States Patent
Flükiger et al.

(10) Patent No.: US 7,505,800 B2
(45) Date of Patent: Mar. 17, 2009

(54) SUPERCONDUCTIVE ELEMENT CONTAINING NB₃SN

(75) Inventors: René Flükiger, Plan-les-Ouates (CH); Vital Abächerli, Giswil (CH); Davide Uglietti, Bernex (CH); Daniel Eckert, Dübendorf (CH)

(73) Assignee: Bruker BioSpin AG, Faellanden (CH)

( * ) Notice: Subject to any disclaimer, the term of this patent is extended or adjusted under 35 U.S.C. 154(b) by 396 days.

(21) Appl. No.: 11/279,282

(22) Filed: Apr. 11, 2006

(65) Prior Publication Data
US 2007/0238620 A1 Oct. 11, 2007

(51) Int. Cl.
H01B 12/06 (2006.01)

(52) U.S. Cl. .................. 505/232; 505/806; 505/821; 505/920; 505/919; 505/917; 174/125.1; 29/599

(58) Field of Classification Search .............. 505/806, 505/821, 920, 919, 917, 232; 174/125.1; 29/599
See application file for complete search history.

(56) References Cited

U.S. PATENT DOCUMENTS

| | | | | |
|---|---|---|---|---|
| 4,367,102 A | * | 1/1983 | Wilhelm | 148/98 |
| 4,687,883 A | * | 8/1987 | Flukiger et al. | 174/125.1 |
| 5,127,149 A | * | 7/1992 | Ozeryansky | 29/599 |
| 5,167,061 A | * | 12/1992 | Ozeryansky | 29/599 |
| 2003/0045433 A1 | | 3/2003 | Iwaki et al. | |
| 2006/0196580 A1 | * | 9/2006 | Iwaki et al. | 148/98 |

FOREIGN PATENT DOCUMENTS

| | | | | |
|---|---|---|---|---|
| EP | 48313 A | * | 3/1982 | |
| EP | 1569285 A1 | * | 8/2005 | |
| GB | 1543149 A | * | 3/1979 | |
| JP | 60250510 A | * | 12/1985 | |

OTHER PUBLICATIONS

Tateishi, H., et al., "Properties of fiber-reinforced niobium-tin superconductor fabricated by bronze process", IEEE Transactions on Applied Superconductivity, 9(2), 1437-1440 (Jun. 1999).*

R.M. Scanlan, D.N. Cornish, J.P. Zbasnik, and R.W. Hoard, J. Wong, R., Randall, "Properties of Multifilamentary Nb3Sn Superconductors Fabricated by the Internal Bronze Approach", Advances in Cryogenic Engineering, vol. 26, Plenum Press, pp. 451-456, New York (1980).

Genzo Iwaki, Junichi Sato, Shoji Inaba, and Kenichi Kikuchi, "Development of Bronze-Processed Nb3Sn Superconducting Wires for High Field Magnets", IEEE Transactions on Applied Superconductivity, vol. 12, No. 1, Mar. 2002.

* cited by examiner

Primary Examiner—Douglas Mc Ginty
(74) Attorney, Agent, or Firm—Walter A. Hackler

(57) ABSTRACT

A superconductive element containing Nb₃Sn, in particular a multifilament wire, comprising at least one superconductive filament (8) which is obtained by a solid state diffusion reaction from a preliminary filament structure (1), said preliminary filament structure (1) containing an elongated hollow pipe (2) having an inner surface (3) and an outer surface (4), wherein said hollow pipe (2) consists of Nb or an Nb alloy, in particular NbTa, wherein the outer surface (4) is in close contact with a surrounding bronze matrix (5) containing Cu and Sn, and wherein the inner surface (3) is in close contact with an inner bronze matrix (5) also containing Cu and Sn, is characterized in that the inner bronze matrix (5) of the preliminary filament structure (1) encloses in its central region an elongated core (6) consisting of a metallic material, said metallic material having at room temperature (=RT) a thermal expansion coefficient $\alpha_{core}<17*10^{-6}K^{-1}$, preferably $\alpha_{core}\leq 8*10^{-6} K^{-1}$, said metallic material having at RT a yield strength $R_{p0,2}>300$ MPa, said metallic material having at RT an elongation at rupture A>20%, and wherein the metallic material of the core (6) is chemically inert with respect to the material of the inner bronze matrix (5) up to a reaction temperature T of the solid state diffusion reaction. This element has improved superconductive properties in a large volume fraction of its superconductive filaments, in particular a high critical temperature $T_c$ and a high critical magnetic filed strength $B_{c2}$, and is mechanically stable enough for commercial applications such as magnet coils.

11 Claims, 4 Drawing Sheets

Prior art

Prior art

SUPERCONDUCTIVE ELEMENT CONTAINING $Nb_3Sn$

BACKGROUND OF THE INVENTION

The invention relates to a superconductive element containing $Nb_3Sn$, in particular a multifilament wire, comprising at least one superconductive filament which is obtained by a solid state diffusion reaction from a preliminary filament structure, said preliminary filament structure containing an elongated hollow pipe having an inner surface and an outer surface, wherein said hollow pipe consists of Nb or an Nb alloy, in particular NbTa, wherein the outer surface is in close contact with a surrounding bronze matrix containing Cu, Sn and possibly other elements, and wherein the inner surface is in close contact with an inner bronze matrix also containing Cu, Sn and possibly other elements.

A superconductor of this type is known from GB 1 543 149 A.

Superconductive $Nb_3Sn$ wires are typically produced by the powder in tube process (PIT-process), by the internal Sn diffusion method, or by the bronze route.

In the bronze route, a number of niobium (Nb) rods are inserted into a copper (Cu) and tin (Sn) containing bronze matrix. By repeated extruding, bundling and insertion into further bronze cans, a ductile wire with numerous Nb fibers embedded in a bronze matrix is obtained. Some pure copper is also introduced into the wire in order to improve its thermal conductivity. The wire is then brought into the desired shape, e.g. by winding the wire into a coil. Subsequently, the wire is annealed at a temperature of about 600-700° C. During this solid state diffusion reaction, Sn originating form the bronze diffuses into the Nb fibers and forms $Nb_3Sn$, which has superconductive characteristics. The $Nb_3Sn$ phase is also called A15 phase. The $Nb_3Sn$ filamentary bundles show diameters of 4 to 5 μm.

The so produced superconductive $Nb_3Sn$ wires show high mechanical stability, small effective filament diameter, <20 μm and high homogeneity for very long lengths (well above 3 km).

Typically the Nb fibers do not completely react to $Nb_3Sn$, but some Nb remains unreacted within the filaments. Within the $Nb_3Sn$ phase, a concentration gradient yields, varying from 25 atomic % Sn content near the boundary to the bronze matrix to 18% Sn content near the unreacted Nb core.

The Cu—Sn/Nb composite billet is fabricated by assembling a certain number of rods, consisting of a Nb core inside a Cu—Nb tube, surrounded by an external Cu—Sn can. The deformation occurs by extrusion and wire drawing. The obtained hexagonal rods are bundled and again inserted into a Cu—Sn can, followed by a second extrusion and hexagonal wire drawing. A third bundling and extrusion is followed by wire drawing to the final wire diameter, of the order of 1 mm. At this point, the Nb filament is around 5 μm, the total number of filaments reaching up to 10,000.

$Nb_3Sn$ with low Sn content exhibits inferior superconductive properties, in particular a low critical temperature $T_c$ and low critical magnetic field strength $B_{c2}$. Therefore, high and homogeneous Sn contents in the $Nb_3Sn$ phase are desired. The Sn content in the $Nb_3Sn$ phase can be increased by increasing the annealing temperature (=reaction temperature) and/or the annealing time (=reaction time). However, this also induces accelerated grain growth, which deteriorates the superconductive properties of the filament again.

The described Bronze route process is well established and is at the present day the fabrication method covering the largest part of the market. However, recent important progress in the two other techniques, the "Internal Sn" process and the Powder-In-Tube (or PIT) process has created a new situation: a further improvement of the critical current densities of bronze route $Nb_3Sn$ wires is mandatory to remain competitive in the market. The necessity of such an improvement is also illustrated by the fact that the costs of bronze route wires may exceed those of Internal Sn wires by a factor two.

In GB 1 543 149 A, a method for producing a $Nb_3Sn$ based superconductive wire is described. It is proposed to use a Nb tube and arrange a bronze matrix within said tube and a bronze matrix outside said tube. This arrangement is subjected to an extension and wire drawing process. During a thermal treatment, $Nb_3Sn$ is formed both on the inner surface of the Nb tube and the outer surface of the Nb tube. By this means, Sn is introduced into the Nb material from two sides, improving the Sn supply.

However, it has been found out that wires produced by the method described in GB 1 543 149 A cannot be used in superconducting magnets due to a poor mechanical stability:

In their publication "Properties of Multifilamentary Nb3Sn Supercondutors Fabricated by the Internal Bronze Approach", Advances in Cryogenic Engineering, Vol. 26, Plenum Press, pp. 451-456, New York (1980), R. M. Scanlan et al. state:

"The highest critical current densities in the $Nb_3Sn$ layer obtained by the internal bronze approach were about 600 A/mm$^2$ (at 12 T), compared with about 2500 A/mm$^2$ (at 12 T) for the external bronze approach. This lower value is believed to be due to the higher strains produced in the $Nb_3Sn$ layer in the internal bronze configuration."

After annealing, the superconductive wire shrinks during cooling. Bronze has a relatively high thermal expansion coefficient $\alpha_{bronze}$ of $17*10^{-6}K^{-1}$, compared to $Nb_3Sn$ with $\alpha_{Nb3Sn}$ of $9*10^{-6}K^{-1}$. Therefore, bronze shrinks more than the $Nb_3Sn$ phase (which originated from the Nb tube) during the final cooling. The outer bronze matrix exerts a radial compressive stress onto the $Nb_3Sn$ phase, whereas the inner bronze matrix within the $Nb_3Sn$ phase exerts a tensile stress onto the $Nb_3Sn$ phase. As a result, the $Nb_3Sn$ phase undergoes shear stresses which destabilize the superconductive filament. The Nb3Sn phase can peel off the bronze matrices and crack. For these reasons, the "double bronze technique" described in GB 1 543 149 A was rejected by the experts in the field and has never been used in commercial applications.

In their publication "Development of Bronze-Processed $Nb_3Sn$ Superconducting Wires for High Field Magnets", IEEE Transaction on Applied Superconductivity, Vol. 12, No. 1, pp. 1045-1048 (2002), G. Iwaki et al. describe a preliminary filament structure with a Nb tube, an inner tantalum matrix and an outer bronze matrix is described. During annealing, at the outer surface of the Nb tube a $Nb_3Sn$ phase is formed.

SUMMARY OF THE INVENTION

It is the object of the invention to provide a superconductive element containing $Nb_3Sn$ that has improved superconductive properties in a large volume fraction of its superconductive filaments, in particular a high critical temperature $T_c$ and a high critical magnetic field strength $B_{c2}$, and which is mechanically stable enough for commercial applications such as magnet coils.

This object is achieved, in accordance with the invention, by a superconductive element as introduced in the beginning, characterized in that the inner bronze matrix of the preliminary filament structure encloses in its central region an elongated core consisting of a metallic material, said metallic material having a thermal expansion coefficient $\alpha_{core}<17*10^{-6}K^{-1}$, preferably $\alpha_{core}\leq 9*10^{-6}K^{-1}$, said metallic material having a yield strength $R_{p0.2}>300$ MPa, said metallic material having an elongation at rupture A>10%, and wherein the metallic material of the core is chemically inert with respect to the material of the inner bronze matrix up to a reaction temperature T of the solid state diffusion reaction.

The inventive elongated core replaces a considerable part of the inner bronze matrix that has been used in the "double bronze technique" of the state of the art. During the cooling after the annealing (i.e. after the temperature treatment inducing the solid state diffusion reaction), the core metallic material shrinks less than the bronze material of the inner matrix ($\alpha_{Cu}=\alpha_{bronze}=17*10^{-6}K^{-1}$). As a result, the tensile stress exerted by the inner bronze matrix onto the $Nb_3Sn$ phase (which originated from the Nb containing hollow pipe during annealing) is lessened. Thus the shear stresses that are introduced into the $Nb_3Sn$ phase by the inner and outer bronze matrix are reduced. The mechanical stability of the superconductive filament is significantly improved as compared to the state of the art.

Since the thermal expansion coefficient of the core material $\alpha_{core}$ is much smaller than the one of the inner bronze matrix $\alpha_{CuSn}$ of $17*10^{-6}K^{-1}$, the "overall" thermal expansion coefficient exerted by the core and the inner bronze together on the $Nb_3Sn$ phase $\alpha_{Nb3Sn}$ of $9*10^{-6}K^{-1}$ becomes smaller than $17*10^{-6}K^{-1}$ and therefore the unfavorable three dimensional stress state exerted by the inner bronze matrix on the $Nb_3Sn$ phase has a less deteriorating influence on the superconducting properties. The compressive pre-stress from the outer bronze matrix stabilizes the $Nb_3Sn$ material mechanically, since it helps to prevent tensile stress within the $Nb_3Sn$ phase, e.g. when Lorenz forces act upon the superconductive element as part of a magnet coil. In brittle material such as $Nb_3Sn$, the fracture toughness in tension is generally much lower than the fracture toughness in compression.

In a highly preferred embodiment of the inventive superconductive element, the metallic material of the core comprises Ta or a Ta alloy. The physical properties of tantalum and alloys rich in tantalum fulfill the requirements for the metallic material of the core as specified above. Tantalum possesses a relatively low thermal expansion coefficient $\alpha_{Ta}$ of $6*10^{-6}$ $K^{-1}$, a yield strength high enough to exert considerable stress onto the surrounding inner bronze matrix and the $Nb_3Sn$ phase, a high ductility sufficient for wire drawing in only few steps, and inertness with respect to Cu—Sn-bronze.

A high yield strength is required to enable the core to exert stress onto the inner bronze matrix and the $Nb_3Sn$ phase. Below 700° C., the Ta core does not react with the Sn from the inner matrix material, so that enough Sn is available to react the Nb of the hollow tube into $Nb_3Sn$. Furthermore, core material does not diffuse in significant amounts into the inner bronze matrix material, and inner bronze matrix material does not diffuse in significant amounts into the core material. Then the mechanical properties of the core metallic material remain substantially constant during the solid state diffusion reaction.

A preferred further development of this embodiment is characterized in that the metallic material of the core comprises tantalum in an atomic concentration $c_{Ta,\ core}\geq 90\%$, preferably $C_{Ta,\ core}\geq 95\%$. In this case, the characteristics of tantalum dominate the characteristics of the core material.

Alternatively or in addition, in another preferred further development the metallic material of the core comprises tungsten (W) in an atomic concentration $c_{W,\ core}$ of $\leq 5\%$,
and/or molybdenum (Mo) in an atomic concentration $C_{Mb,\ core}$ of $\leq 5\%$, and/or titanium (Ti) in an atomic concentration $C_{Ti,\ core}$ of $\leq 5\%$, and/or vanadium (V) in an atomic concentration $c_{V,\ core}$ of $\leq 5\%$. Said metals are particularly preferred due to their high melting points.

In another preferred embodiment of the inventive superconducting element, the inner surface and the outer surface of the hollow pipe and the core have a circular shape in cross-section. Circular cross-sections are easy to produce, and during bundling or rolling (e.g. for producing a band-shaped superconductor), no texture needs to be taken into account.

Another highly preferred embodiment provides that the core is arranged coaxial with respect to the hollow pipe. In particular in combination with circular cross-sectional shapes, a homogeneous stress distribution can be obtained in the superconductive filament.

Further preferred is an embodiment of the inventive superconductive element wherein the hollow pipe has a maximum outer diameter $d_{max,\ pipe}$ with $3\ \mu m\leq d_{max,\ pipe}\leq 20\ \mu m$, preferably with $10\ \mu m\leq d_{max,\ pipe}\leq 15\ \mu m$. In these dimensions, a good stabilization effect of the core and an easy access of Sn to the hollow pipe are available.

The mechanical stabilization of the superconductive filament is optimized by an embodiment wherein $a_{core}>0.05\ a_{inner\ surface}$, in particular $a_{core}>0.1\ a_{inner\ surface}$, with $a_{core}$ the cross-sectional area of the core, and $a_{inner\ surface}$ the cross-sectional area enclosed by the inner surface of the hollow pipe.

Another preferred embodiment provides that the hollow pipe has a wall thickness w with $0.5\ \mu m<w<10\ \mu m$, preferably $2\ \mu m<w<5\ \mu m$, in particular $w\approx 3\ \mu m$. With a small wall thickness w of about 0.5 µm to 1 µm, the Nb containing hollow pipe can be saturated with Sn before significant grain growth occurs. With larger wall thickness, typically corresponding to larger pipe diameters, the amount of $Nb_3Sn$ per filament obtainable increases, so a large cross section area of superconductive material can be obtained within only few extension and bundling cycles.

It is advantageous, if the superconductive filament is obtained by a solid state diffusion reaction which is performed at a reaction temperature T with $400°\ C.\leq T\leq 800°\ C.$, preferably $550°\ C.\leq T\leq 700°\ C.$, in particular wherein the solid state diffusion reaction is done by high temperature isostatic pressing (=HIP). In this temperature region, the diffusion of Sn from the bronze matrices into the Nb containing hollow pipe is relatively fast, and grain growth within the formed $Nb_3Sn$ is relatively slow. HIP processing helps to establish compressive pre-stress within the $Nb_3Sn$ phase.

Alternatively or in addition, another preferred embodiment provides that the superconductive filament is obtained by a solid state diffusion reaction which is performed in an oxygen-free atmosphere with a partial pressure of oxygen $p_{O2}\leq 10^{-5}$ mbar, in particular in vacuum or in an inert atmosphere having substantially the air pressure of the environment, wherein the inert atmosphere preferably comprises Ar and/or $N_2$.

Also in the scope of the present invention is a method for producing an inventive superconductive element, characterized in that the reaction conditions of the solid state diffusion reaction, in particular the reaction temperature T, the reaction time t, and/or the heating rates R are selected such that all Nb contained in the hollow pipe of the preliminary filament structure is reacted to $Nb_3Sn$. In this case, the maximum superconductive cross-sectional area possible per filament is obtained.

In a preferred variant of this method, the reaction conditions of the solid state diffusion reaction, in particular the reaction temperature T, the reaction time t, and/or the heating rates R are selected such that the atomic concentration of Sn in the $Nb_3Sn$ phase of the superconductive filament is at least 23%, preferably at least 24%. The minimum Sn concentration is present everywhere in the $Nb_3Sn$ phase. Above 23% Sn content, the superconductor characteristics of the $Nb_3Sn$ phase are particularly good, with high critical magnetic field $B_{c2}$ and high critical temperature $T_c$. These Sn concentrations are easily available due to the double-sided Sn supply to the hollow pipe.

Further advantages can be extracted from the description and the enclosed drawing. The features mentioned above and below can be used in accordance with the invention either individually or collectively in any combination. The embodiments mentioned are not to be understood as exhaustive enumeration but rather have exemplary character for the description of the invention.

DESCRIPTION OF PREFERRED EMBODIMENTS

Figure 2A:
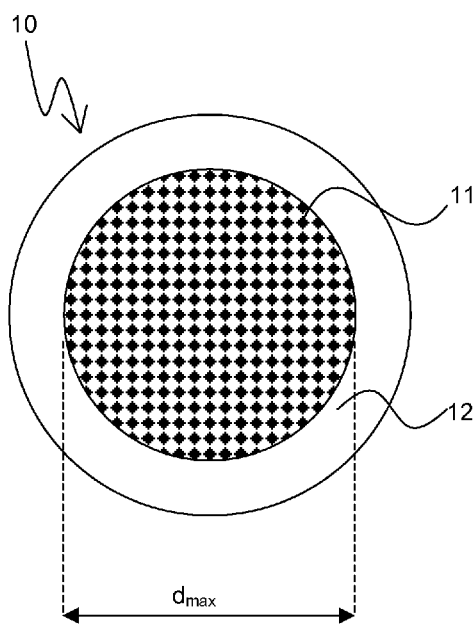
FIG. 2a shows a schematic cross-sectional view of a preliminary filament structure before the solid state diffusion according to a conventional bronze route (prior art)
Figure 2B:
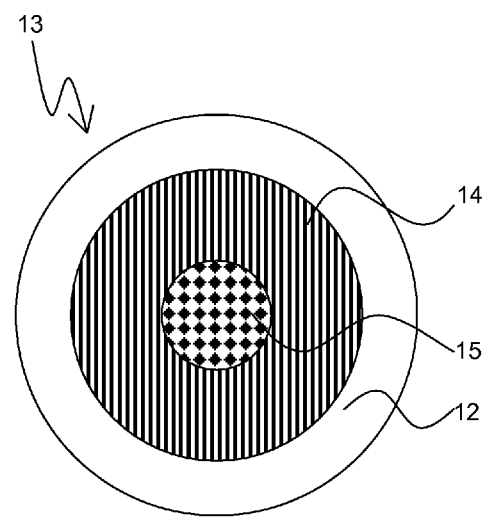
FIG. 2b shows a schematic cross-sectional view of a superconductive filament of an superconductive element according to a conventional bronze route (prior art)

FIG. 2a shows a preliminary filament structure 10 of a usual bronze route for fabrication of $Nb_3Sn$ wires with diameters of 4 to 5 µm. In a typical inventive superconductive wire, there are some thousands of superconductive filaments, typically grouped in bundles. The bundles are usually grouped around a pure copper core or arranged within a pure copper tube (not shown). The preliminary filament structure 10 comprises a rod 11. Originally, the rod 11 consist of ductile Nb (or NbTa), which reacts gradually with Sn (from the Cu—Sn bronze) to $Nb_3Sn$ by annealing it at an elevated reaction temperature T in order to induce a solid state diffusion reaction, which transforms the preliminary filament structure 10 into a superconductive filament structure 13. From FIG. 2b it can be seen that the superconductive filament structure 13 consists of an unreacted Nb core 15, surrounded by a superconductive $Nb_3Sn$-phase 14. The inner part of the filament, that is the unreacted Nb core 15, is thus normal conducting and does not contribute to the value of $j_c(s.c.)$.

A comparison of the above described bronze route with the other two processes, the "Internal Sn" and the "Powder-In-Tube" (or PIT) shows that their critical current density, $j_c$, is considerably higher than that of bronze wires. This is due to the low Sn content in the bronze route wires, i.e. 15.4 wt. % Sn, i.e. much lower than for the other two techniques, where the Sn content is well above 20 wt. %, the remaining unreacted Nb core 15 and the distribution of $Nb_3Sn$ grain sizes in bronze route wires which comprises a wide range, i.e. between 80 and 200 nm.

Figure 3A:
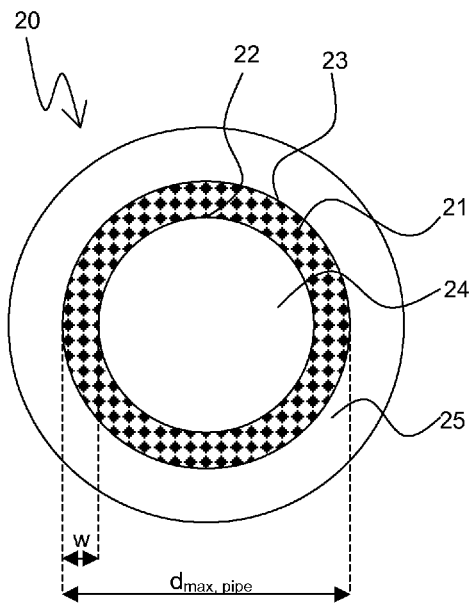
FIG. 3a shows a schematic cross-sectional view of a preliminary filament structure before the solid state diffusion reaction according to a conventional double bronze route (prior art)
Figure 3B:
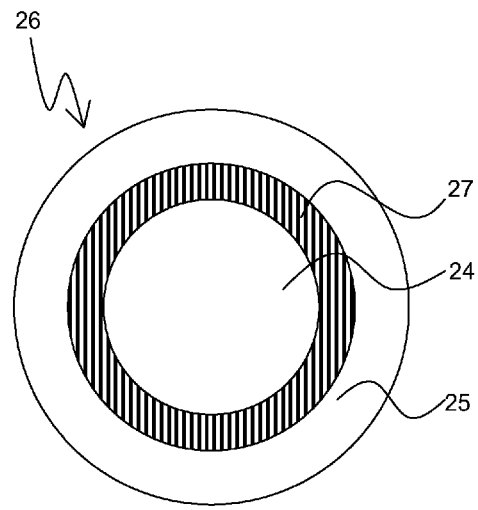
FIG. 3b shows a schematic cross-sectional view of a superconductive filament of an superconductive element according to a conventional double bronze route (prior art)

FIGS. 3a, 3b show a preliminary filament structure 20 before the solid state diffusion and a superconductive filament structure 25 of a superconductive element respectively according to a conventional double bronze route. The main difference between the usual bronze route and the "double bronze" route consists in the fact that the filament diameter $d_{max}$ is replaced by the wall thickness w. A rapid estimation shows that it is considerably easier to reach a wall thickness of less than 1 µm than a filament of comparable diameter. Each preliminary filament 20 consists of a concentric arrangement comprising a hollow pipe 21 containing Nb. The hollow pipe 21 has an inner surface 22 and an outer surface 23. The inner surface 22 is in close contact with an inner Cu—Sn bronze tube 24. The outer surface 23 of the hollow pipe 21 is in contact with a surrounding, outer bronze matrix 25. In contrast to the conventional bronze route wires, which show a filament diameter close to 5 µm and an effective diffusion length of the order of 2-2.5 µm, the double bronze technique allows a variation of the $Nb_3Sn$ wall thickness from 2 µm down values well below 1 µm, with the same number of extrusions. The overall filament diameter of double bronze wires can be varied within a wide range, between 5 and 15 µm. This depends on the initial dimensions and does not require additional deformation steps. Further, in analogy to "in situ" wires with very thin filament diameters, the thin A15 wall thickness allows to obtain shorter reaction times, and thus smaller grain sizes. This is expected to considerably enhance the critical current density values, in particular at the industrially interesting intermediate field range of 12 to 16 T.

Figure 4:
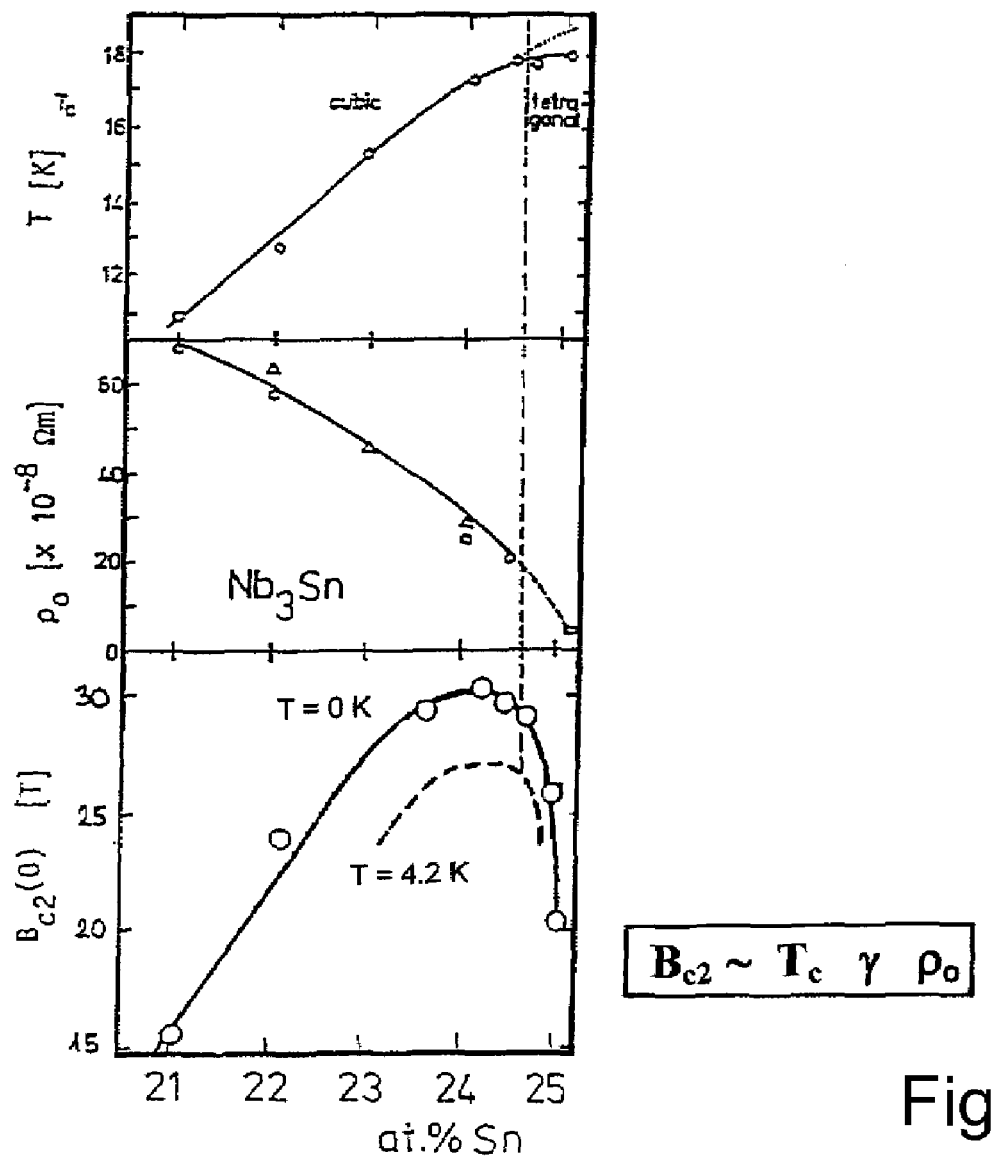
FIG. 4 shows the variation of $T_c$, $\rho_o$ and $B_{c2}(0)$ as a function of the Sn content in the system $Nb_3Sn$.

Double bronze wires as shown in FIG. 3b with thinner wall thickness w do not exhibit unreacted Nb—Ta cores anymore. As a consequence the NbTa hollow cylinder is in contact with the Cu—Sn bronze at both the inner and the outer surfaces. Therefore only compositions close to stoichiometry are formed. As shown in FIG. 4, these compositions have quite low $T_c$ and $B_{c2}$ values. The consequence is that they are normal conducting at magnetic fields B>12 T! They thus do not contribute to the super current transport. Thus, the more homogeneous Sn distribution inside the layer has the consequence of an enhancement of the $j_c$ value, at all fields.

However the wires produced by the conventional double bronze route do not exhibit higher $j_c$ values because of mechanical instabilities. The Cu—Sn bronze tube 24 at the inner side of the A15 ring shrinks during cool down. Not only there is no precompression effect, but in addition, radial stresses are introduced, finally leading to a damage of the A15 layer and thus to lower $j_c$ values.

Figure 1A:
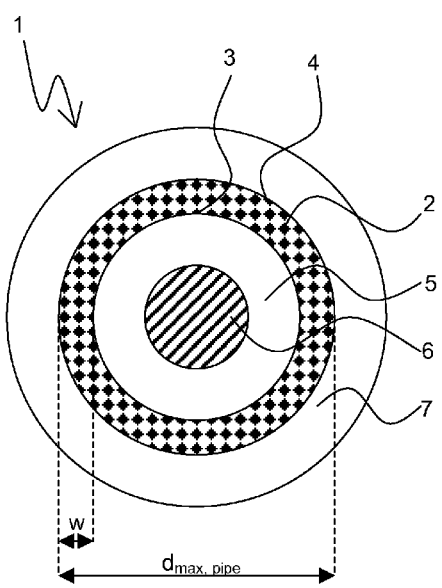
FIG. 1a shows a schematic cross-sectional view of a preliminary filament structure before the solid state diffusion reaction in accordance with the invention.

In FIG. 1a, a preliminary filament structure 1 in accordance with the invention is shown in a schematic cross-sectional view. The preliminary filament structure 1 is intended to be annealed at an elevated reaction temperature T in order to induce a solid state diffusion reaction, which transforms the preliminary filament structure 1 into a superconductive filament. Such a superconductive filament is described later in FIG. 1b.

The preliminary filament structure 1 comprises a hollow pipe 2. The material of the hollow pipe 2 contains Nb. The Nb is present as a substantially pure metal, or as a Nb containing mixed crystal, or as an intermetallic compound containing Nb. Preferably, the atomic concentration of Nb in the hollow pipe is about 50% or more. In this embodiment, a Nb-7.5% Ta alloy is used. The hollow pipe 2—as well as all other parts of the preliminary filament structure 1—is elongated in the direction perpendicular to the drawing plane of FIG. 1a.

The hollow pipe 2 has an inner surface 3 and an outer surface 4. The inner surface 3 is in close contact with an inner bronze matrix 5. The inner bronze matrix 5 is a Cu and Sn containing bronze alloy, with an Sn content of about 15.5 weight %. The inner bronze matrix 5 surrounds a core 6 which consists of tantalum.

The outer surface 4 of the hollow pipe 2 is in contact with a surrounding, outer bronze matrix 7. The outer bronze matrix 7 typically consists of the same material as the inner bronze matrix 5. The outer bronze matrix 7 can be ring-shaped in cross-section, but may also stretch along a wide area. In particular, the outer bronze matrix of a first preliminary filament structure may verge into an outer bronze matrix of a second, neighboring preliminary filament structure (not shown).

The parts 2-7 of the preliminary filament structure 1 have a circularly cylindrical geometry. In particular, the core 6 is arranged concentrically within the inner surface 3 of the hollow pipe 2.

The hollow pipe 2 has a wall thickness w, measured in a radial direction, on the micron range or the sub-micron range. The maximum outer diameter of the hollow pipe 2 $d_{max.pipe}$ is typically on the order of 5 to 20 μm.

Figure 1B:
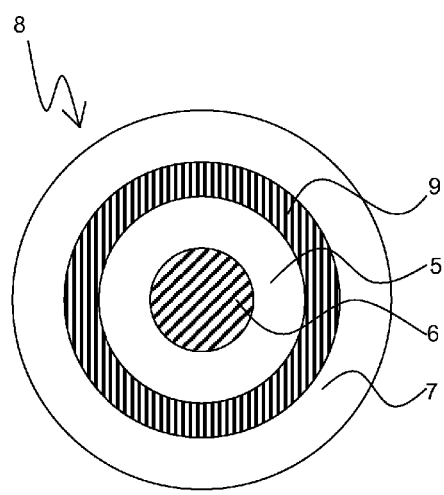
FIG. 1b shows a schematic cross-sectional view of a superconductive filament of an inventive superconductive element.

FIG. 1b shows a superconductive filament 8 that originated from the preliminary filament structure 1 of FIG. 1a by a thermal annealing in an oxygen-free environment. During said annealing, Sn diffused from the inner bronze matrix 5 and the outer bronze matrix 7 into the hollow pipe 2. This Sn and the Nb contained in the hollow pipe form a $Nb_3Sn$ phase 9. The $Nb_3Sn$ phase 9 is substantially located where the hollow pipe 2 used to be. However, due to a volume increase of about 37% from Nb to $Nb_3Sn$, the $Nb_3Sn$ phase 9 requires a little more room than the hollow pipe 2 required before. The bronze matrices 5, 7 in the vicinity of the $Nb_3Sn$ phase 9 have lost most of their Sn, typically resulting in a Sn concentration of about 2-5 weight % %.

The core 6 remained basically unchanged during the annealing. It prevented the inner bronze matrix 5 from exerting tensile stress radially inward onto the $Nb_3Sn$ phase 9. During the annealing, all materials of the superconductive element 8 were basically stress-free. During cooling, the core 6 shrinked less than the inner bronze matrix 5, therefore the core 6 compensates partially the unfavorable stresses exerted onto the inner surface of the $Nb_3Sn$ phase 9.

A superconductive element containing superconductive filaments 8 may be deformed in order to produce desired wires or tapes, e.g. by two-axis rolling in order to get a homogeneous aspect ratio over the whole cross section.

It is expected that the inventive double bronze method produces no large columnar grains, which usually occur at the interface $Nb/Nb_3Sn$. A sizeable enhancement of the number of small grains and thus of grain boundaries is the consequence, which in turn means an enhancement of pinning centers at the grain boundaries. The corresponding expected increase of $j_c$ is of a particular importance at intermediate fields (12-16 T).

The new configuration of the present invention diminishes the problems of prestress and grain growth arising with the known double bronze method due to the following effects: The thickness of the A15 ring layer can be easily kept at ≦1 μm by changing the initial dimensions. This allows shorter reaction times. Further the total amount of Sn in the Cu—Sn bronze can of course not exceed 15.6 wt. %. However, with the present configuration, the whole available Sn is used up to the highest possible limit. A calculation shows that there is enough Sn to react the whole Nb—Ta ring, which occupies 26 to 28% of the superconductive wire cross-section (bronze+filaments), taking into account 2 wt. % Sn remaining in the bronze after reaction.

It is well known that wires with $Nb_3Sn$ filament diameters below 2 μm show enhanced prestrain values of the order of 0.5%. This causes a decrease of $B_{c2}$, $T_c$ and $j_c$. With the present invention this excess precompression can be partly compensated by inserting a Ta core at the center of each filament, leading to lower $\epsilon_m$ values. Also the inner Ta core compensates the radial stresses partly due to the contraction of the inner bronze ring, which may lead to a damage of the A15 layer.

The present invention therefore presents a possibility to manufacture superconducting elements which comprises the advantages of the "double bronze" process and feature high mechanical stability and increased $j_c$ values. The inventive superconducting element therefore constitutes a promising component for future superconducting applications, e.g. for NMR solenoids, accelerator or fusion magnets etc.

We claim:

1. A superconductive element containing $Nb_3Sn$, in particular a multifilament wire,
   comprising at least one superconductive filament which is obtained by a solid state diffusion reaction from a preliminary filament structure, said preliminary filament structure containing an elongated hollow pipe having an inner surface and an outer surface,
   wherein said hollow pipe consists of Nb or an Nb alloy, in particular NbTa, wherein the outer surface is in close contact with a surrounding bronze matrix containing Cu and Sn,
   and wherein the inner surface is in close contact with an inner bronze matrix also containing Cu and Sn,
   characterized in
   that the inner bronze matrix of the preliminary filament structure encloses in its region an elongated core consisting of a metallic material, said metallic material of Ta or Ta alloy having at room temperature (=RT) a thermal expansion coefficient $\alpha_{core} < 17*10^{-6} K^{-1}$, preferably $\alpha_{core} \leq 8*10^{-6} K^{-1}$, said metallic material having at RT a field strength $R_{p0.2} > 300$ Mpa, said metallic material having at RT an elongation at rupture A>20%, and wherein said metallic material of the core is chemically inert with respect to the material of the inner bronze matrix up to a reaction temperature T of the solid state diffusion reaction.

2. A superconductive element according to claim 1, characterized in that the metallic material of the core comprises tantalum in an atomic concentration $C_{Ta, core} \geq 95\%$.

3. A superconductive element according to claim 1, characterized in that the metallic material of the core comprises
   tungsten (W) in an atomic concentration $C_{W, core} \leq 5\%$,
   and/or molybdenum (Mb) in an atomic concentration $C_{Mb, core} \leq 5\%$
   and/or titanium (Ti) in an atomic concentration $C_{Ti, core} \leq 5\%$,
   and/or vanadium (V) in an atomic concentration $C_{V, core} \leq 5\%$.

4. A superconductive element according to claim 1, characterized in that the core is arranged coaxial with respect to the hollow pipe.

5. A superconductive element according to claim 1, characterized in that the hollow pipe has a maximum outer diameter $d_{max,\ pipe}$ with 3 µm $\leq$ 20 µm, preferably 10 µm $\leq d_{max,pipe} \leq$ 15 µm.

6. A superconductive element according to claim 1, characterized in that $a_{core} > 0.05\ a_{inner}$ surface, in particular $a_{core} > 0.1\ a_{inner}$ surface, with $a_{core}$ the cross-sectional area of the core, and $a_{inner}$ surface the cross-sectional area enclosed by the inner surface of the hollow pipe.

7. A superconductive element according to claim 1, characterized in that the hollow pipe has a wall thickness w with 0.5 µm<w<10 µm, preferably 2 µm<w<5 µm, in particular w≈3 µm.

8. A superconductive element according to claim 1, characterized in that the superconducting filament is obtained by a solid state diffusion reaction which is performed at a reaction temperature T with 400° C.$\leq$T$\leq$800° C., preferably 550° C.$\leq$T$\leq$700° C., in particular wherein the solid state diffusion reaction is done by high temperature isostatic pressing (=HIP).

9. A method for producing a superconductive element according to claim 1, characterized in that the superconducting filament is obtained by a solid state diffusion reaction which is performed in an oxygen-free atmosphere with a partial pressure of oxygen $P_{O2}$<=$10^{-5}$ mbar or in an inert atmosphere having substantially the air pressure of the environment, wherein the inert atmosphere preferably comprises Ar and/or N2.

10. A method for producing a superconductive element according to claim 1, characterized in that the reaction conditions of the solid state diffusion reaction, in particular the reaction temperature T, the reaction time t, and/or the heating rates R are selected such that all Nb contained in the hollow pipe of the preliminary filament structure is reacted to Nb3Sn.

11. A method for producing a superconductive element according to claim 10, characterized in that he reaction conditions of the solid state diffusion reaction, in particular the reaction temperature T, the reaction time t, and/or heating rates R are selected such that the atomic concentration of Sn in the Nb3Sn phase of the superconductive filament is at least 23%, preferably at least 24%.

* * * * *